US011211271B2

(12) United States Patent
Hung et al.

(10) Patent No.: US 11,211,271 B2
(45) Date of Patent: Dec. 28, 2021

(54) SYSTEMS AND METHODS FOR SEMICONDUCTOR STRUCTURE SAMPLE PREPARATION AND ANALYSIS

(71) Applicant: Taiwan Semiconductor Manufacturing Co., Ltd., Hsinchu (TW)

(72) Inventors: Shih-Wei Hung, Kaohsiung (TW); Jang Jung Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 141 days.

(21) Appl. No.: 16/549,856

(22) Filed: Aug. 23, 2019

(65) Prior Publication Data

US 2021/0057247 A1  Feb. 25, 2021

(51) Int. Cl.
*G06K 9/00* (2006.01)
*H01L 21/67* (2006.01)
*G06T 7/00* (2017.01)

(52) U.S. Cl.
CPC ........ *H01L 21/67288* (2013.01); *G06T 7/001* (2013.01); *G06T 2207/10056* (2013.01); *G06T 2207/20081* (2013.01); *G06T 2207/20084* (2013.01); *G06T 2207/30148* (2013.01)

(58) Field of Classification Search
CPC .......................... H01L 21/67288; G06T 7/001
USPC ........................................................ 348/149
See application file for complete search history.

(56) References Cited

U.S. PATENT DOCUMENTS

| 2009/0218490 | A1* | 9/2009 | Suzuki | G06T 7/001 |
| | | | | 250/307 |
| 2012/0061728 | A1* | 3/2012 | Javey | H01L 29/78681 |
| | | | | 257/192 |
| 2015/0147778 | A1* | 5/2015 | Pickard | G01N 1/44 |
| | | | | 435/40.5 |
| 2015/0226539 | A1* | 8/2015 | Roeth | G01N 21/8806 |
| | | | | 356/614 |
| 2016/0011344 | A1* | 1/2016 | Beasley | G03F 7/70916 |
| | | | | 359/360 |
| 2017/0032928 | A1* | 2/2017 | Mele | G01N 21/03 |
| 2017/0125497 | A1* | 5/2017 | Kim | H01L 27/3248 |
| 2017/0207062 | A1* | 7/2017 | Dufresne | H01J 37/26 |
| 2018/0247772 | A1* | 8/2018 | Ahmed | C23C 28/341 |
| 2019/0331608 | A1* | 10/2019 | Terasawa | G01N 21/95623 |
| 2020/0212238 | A1* | 7/2020 | Maimon | H01L 31/03926 |

* cited by examiner

*Primary Examiner* — Stephen P Coleman
(74) *Attorney, Agent, or Firm* — Seed Intellectual Property Law Group LLP

(57) ABSTRACT

Systems and methods are provided for determining defects in a semiconductor structure sample that is prepared for analysis by microscopy. A semiconductor structure sample preparation and analysis system includes a semiconductor structure sample that includes a structure, a protective capping layer on the structure, and a gap filler material on the protective capping layer. A microscopy apparatus acquires an image of the semiconductor structure sample. Sample defect recognition circuitry determines the presence of a defect in the semiconductor structure sample based on the acquired image.

20 Claims, 5 Drawing Sheets

SYSTEMS AND METHODS FOR SEMICONDUCTOR STRUCTURE SAMPLE PREPARATION AND ANALYSIS

BACKGROUND

Defect analysis is an important part of semiconductor device fabrication. For example, defects may occur in various structures that are formed during fabrication of semiconductor devices. Such defects may be the result of faulty processes employed during fabrication, or of various other causes, such as faults in the materials used during fabrication of the devices.

Analysis of defects may include acquiring a thin sample of a semiconductor structure that is formed on a semiconductor wafer. The sample may then be analyzed by microscopy equipment in order to determine whether the sample includes defects, such as defects which may be caused by one or more of the fabrication processes.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
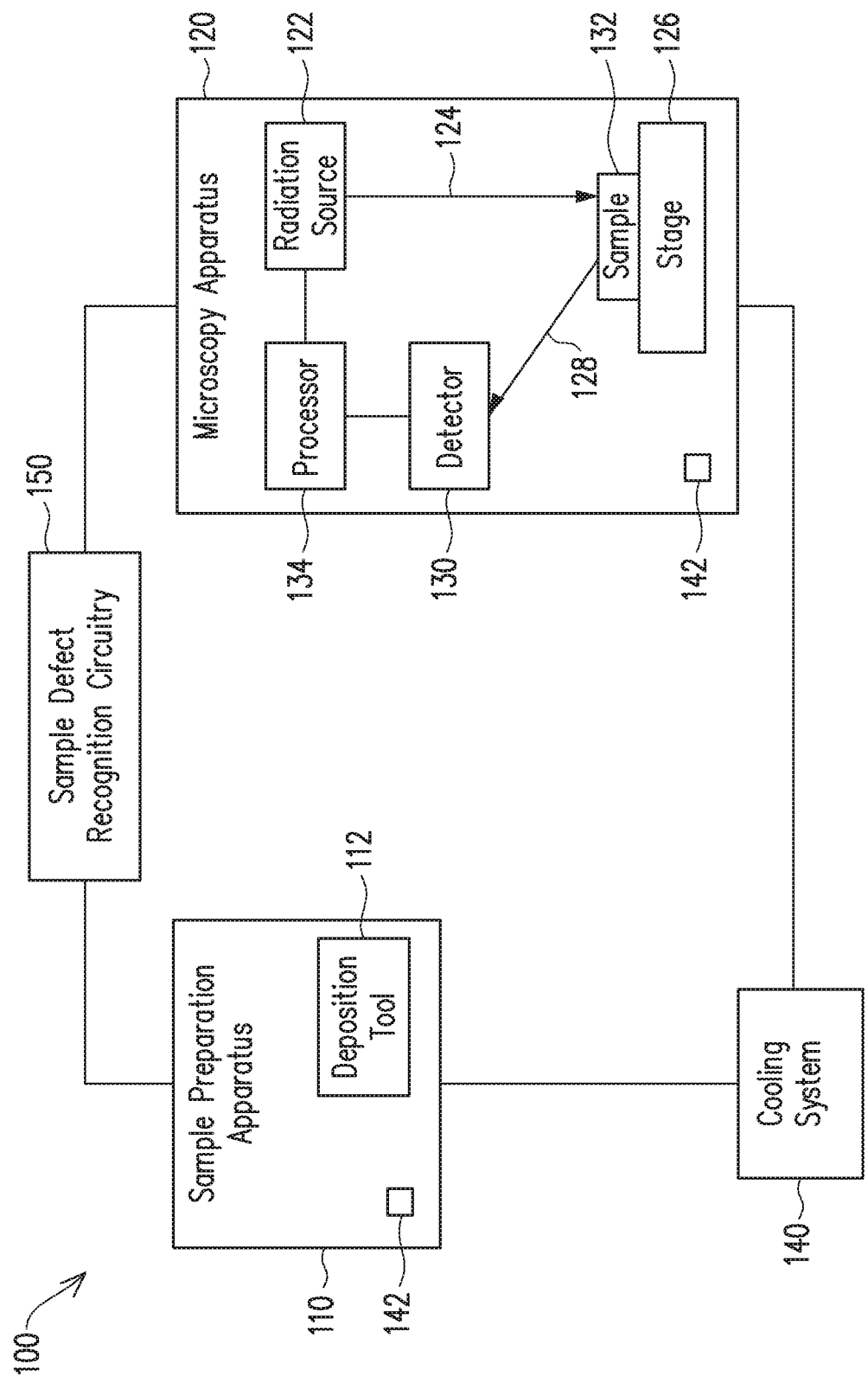
FIG. 1 is a block diagram schematically illustrating a semiconductor structure sample preparation and analysis system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, the present disclosure provides systems, methods, and devices in which a defect in a semiconductor structure sample may be recognized or determined.

Embodiments provided herein include systems and methods for determining the presence of defects in a semiconductor structure sample (e.g., a sample prepared for microscopy analysis) based on images that are acquired of the semiconductor structure sample. In some embodiments, machine learning techniques are utilized to analyze the acquired images of the semiconductor structure sample, and the analysis may be based at least in part on historical images of semiconductor structure samples that are stored in a sample defect database.

In various embodiments, semiconductor structure samples are provided in which a protective capping layer has properties (e.g., high strength and high hardness) which facilitates a strong adhesion between the protective capping layer and a gap filler material so that the gap filler material does not shrink or deform during irradiation of the sample by an electron beam.

FIG. 1 is a block diagram schematically illustrating a semiconductor structure sample preparation and analysis system 100, in accordance with one or more embodiments of the present disclosure.

As shown in FIG. 1, the system 100 may include a sample preparation apparatus 110 and a microscopy apparatus 120. The sample preparation apparatus 110 may be utilized to prepare a sample of a semiconductor structure for analysis by the microscopy apparatus 120. For example, the sample may be a portion of a semiconductor wafer on which various semiconductor layers, conductive layers, insulating layers, and the like have been formed during previous processing of the wafer.

The sample preparation apparatus 110 may include any features or components of sample preparation apparatuses known to those skilled in the relevant field. The sample preparation apparatus 110 may be utilized to obtain a thin sample of a structure which may be analyzed, e.g., by the microscopy apparatus 120, for process validation, for determining defects, or the like. For example, thin samples are may be used in the analysis of structures by the microscopy apparatus 120, which may be any suitable microscopy apparatus or tool for examining or characterizing one or more structures of the sample, including, for example, a transmission electron microscopy (TEM) apparatus, a scanning electron microscopy (SEM) apparatus, or an atom probe microscopy apparatus.

In preparing thin samples of structures for analysis by the microscopy apparatus 120, various polishing and milling processes may be performed (e.g., by the sample preparation apparatus 110) so that samples having a suitable thickness (e.g., less than 1 µm, in some embodiments) can be obtained. In various embodiments, the sample preparation apparatus 110 may include any of a variety of components or features to prepare a sample of a structure (e.g., which is prepared from a semiconductor wafer or the like) having desired dimensions for analysis by the microscopy apparatus 120.

In various embodiments, the sample preparation apparatus 110 may include features and functionality to form or to remove one or more layers from a portion of the semiconductor wafer, in order to obtain a sample of a structure that is to be characterized or measured by the microscopy apparatus 120. For example, in some embodiments, the sample preparation apparatus 110 may include a deposition tool 112 which may be configured to perform one or more of focused ion beam (FIB), reactive ion etching (ME), or ion milling techniques for preparing the sample of the semiconductor structure to be analyzed by the microscopy apparatus 120. As an example, in the FIB technique, focused ion beams are used to either locally deposit or remove materials to obtain the sample of the semiconductor structure. The ionized beam containing a cluster of atoms is focused onto the surface of the semiconductor structure, and the cluster of atoms which is scattered over the surface and deposited to form a film or layer of a material on the semiconductor structure. This technique can be used to deposit various layers over the semiconductor structure, including, for example, conductive layers (e.g., metals such as epitaxial aluminum, or the like), insulating layers (e.g., oxides such as silicon oxide, or the like), protective capping layers, or any other layers which may be provided on a semiconductor structure of a sample to be analyzed by the microscopy apparatus 120.

In some embodiments, the deposition tool 112 is configured to form a protection layer on at least a portion of one or more structures of the sample, and in some embodiments, the deposition tool 112 is configured to form a gap filling layer between the one or more structures of the sample.

The microscopy apparatus 120 may include any features or components of microscopy apparatuses known to those skilled in the relevant field. In various embodiments, the microscopy apparatus 120 may be a transmission electron microscopy (TEM) apparatus, a scanning electron microscopy (SEM) apparatus, or an atom probe microscopy apparatus. The microscopy apparatus 120 is utilized to analyze a sample semiconductor structure, such as a sample prepared by the sample preparation apparatus 110, and may be utilized for process verification or to determine defects in the semiconductor wafer.

As shown in FIG. 1, the microscopy apparatus 120 may include an electromagnetic radiation source 122 which generates an electromagnetic radiation beam 124, a stage 126, and a detector 130 which receives an analysis or measurement signal 128. It will be readily appreciated that other configurations and the inclusion or omission of various features or components in the microscopy apparatus 120 may be possible in various embodiments, depending for example on a type of microscopy apparatus, or a type of measurement or analysis to be performed on the sample 132. In the depicted embodiment, the microscopy apparatus 120 is used to determine or characterize features of a structure of the sample 132, such as measurements (e.g., shape or dimensions) of the structure, chemical composition of the structure, or defects in the structure, and the microscopy apparatus 120 may further be utilized to determine a source of any such defects in a semiconductor fabrication process. For example, the microscopy apparatus 120 may be utilized to validate or otherwise adjust a semiconductor fabrication process.

The sample 132 may include a semiconductor wafer substrate, a mask substrate, a semiconductor device, or a portion of a semiconductor wafer substrate, a mask substrate or a semiconductor device.

The electromagnetic radiation source 122 may include a source which generates the electromagnetic radiation beam 124, such as a light beam, an electron beam, or an ion beam.

The stage 126 may be any structure suitable for securing the sample 132 and, in some embodiments, may provide for or otherwise facilitate movement of the sample 132 in one or more directions (e.g., X, Y and Z directions) or rotation of the sample 132. In various embodiments, the stage 126 may include motors, roller guides, tables, or the like for accurately positioning and moving the sample 132 in any desired direction and for allowing an electromagnetic radiation beam to be focused to desired portions of the sample 132. The measurement signal 128 may include an electromagnetic radiation pulse signal generated by an interaction between one or more features of the sample 132 (e.g., a structure to be analyzed) and the electromagnetic radiation beam 124 focused on the sample 132. The detector 130 receives the measurement signal 128 and converts the measurement signal 128 to a characterization of the structure of the sample 132, such as a visual representation (e.g., a SEM, TEM, or atom probe image) of the structure of the sample 132 using a processor 134. The detector 130 may include a light detector, an electron detector, an ion detector, or the like. The processor 134 may be or include any computer processor, microprocessor, processing circuitry or the like which is operable to convert the measurement signal 128 to the characterization (e.g., an image) of the structure of the sample 132. In some embodiments, the processor 134 may be operable to control emission of the electromagnetic radiation beam 124 from the electromagnetic radiation source 122.

In some embodiments, the sample preparation apparatus 110 and the microscopy apparatus 120 are combined or otherwise included in a same apparatus. For example, the features and functionalities described herein with respect to sample preparation and microscopy analysis may be performed by a same apparatus in some embodiments. Moreover, in various embodiments, the sample preparation apparatus 110 may include a stage having any of the features or functionalities described herein with respect to the stage 126 of the microscopy apparatus 120. For example, the stage of the sample preparation apparatus 110 may be configured to hold a semiconductor wafer from which the sample 132 is extracted, and may further be configured to hold the sample or the wafer during deposition of various layers, such as a protective capping layer and a gap filler which features will be described in further detail herein.

In some embodiments, the system 100 further includes a cooling system 140 which is operable to control a temperature of an environment within the sample preparation apparatus 110 or the microscopy apparatus 120. For example, in some embodiments, the cooling system 140 maintains a temperature within a chamber or similar environment in which the sample 132 is located in either or both of the sample preparation apparatus 110 and the microscopy apparatus 120. The cooling system 140 may include various features or components as may be known in cooling systems. In some embodiments, the cooling system 140 may include a fluid pump and one or more fluid conduits through which a flow of a cooling fluid may be provided to cool the environment in which the sample 132 is located (e.g., within the sample preparation apparatus 110 or the microscopy apparatus 120). In various embodiments, the cooling fluid utilized by the cooling system 140 may be air, water, liquid nitrogen ($LN_2$), liquid helium (LHe), or any other suitable coolant.

In some embodiments, the cooling system 140 may include one or more temperature sensors 142 located in an environment in which the sample 132 is disposed and which is cooled by the cooling system 140. For example, the cooling system 140 may include a temperature sensor 142 located within the sample preparation apparatus 110 (e.g., within a chamber of the sample preparation apparatus 110 in which the sample 132 is taken from the semiconductor wafer) or a temperature sensor 142 located within the microscopy apparatus 120 (e.g., within a chamber of the microscopy apparatus 120 in which the sample 132 is analyzed by the microscopy apparatus 120). The temperature sensors 142 may provide a temperature reading of the environment to a processor or control circuitry included as part of the cooling system 140, and the cooling system 140 may adjust the temperature of the environment (e.g., by increasing the flow of the cooling fluid, etc.) based on the temperature measured by the temperature sensors 142. In some embodiments, the cooling system 140 maintains the temperature of the environment in the sample preparation apparatus 110 or in the microscopy apparatus 120 to be less than 25° C. In some embodiments, the cooling system 140 maintains the temperature of the environment to be less than 20° C., and in some embodiments, less than 10° C. As will be discussed in further detail later herein, maintaining the temperature of the environment in which the sample 132 is located at a suitably low temperature can help prevent or reduce defects in the sample 132.

The system 100 may further include sample defect recognition circuitry 150 which may be communicatively coupled to the sample preparation apparatus 110 or the microscopy apparatus 120 and which is operable to detect or predict the presence of one or more defects in the sample 132, for example, employing artificial intelligence techniques such as by image recognition or the like. This will be described in further detail with respect to FIG. 4.

Figure 2:
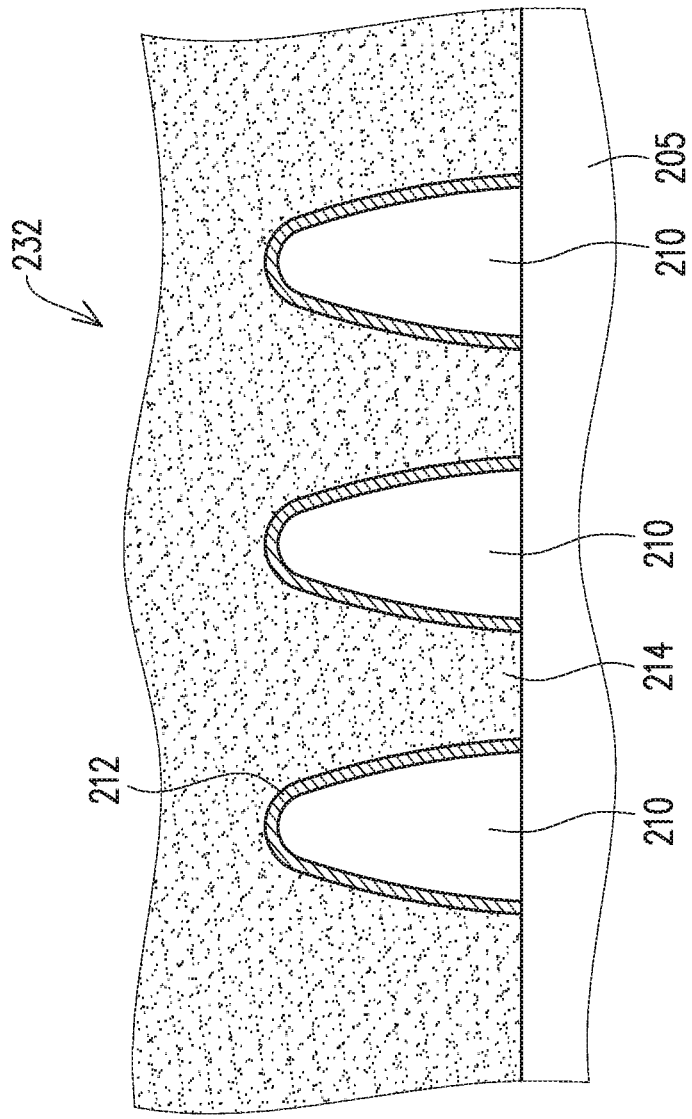
FIG. 2 is a cross-sectional diagram illustrating a sample semiconductor structure, in accordance with some embodiments.

FIG. 2 is a cross-sectional diagram illustrating a sample semiconductor structure in accordance with one or more embodiments of the present disclosure.

The sample 232 may be any sample prepared by the sample preparation apparatus 110, such as the sample 132 described with respect to FIG. 1. For example, the sample 232 may be a portion of a semiconductor wafer on which various semiconductor layers, conductive layers, insulating layers, and the like have been formed during previous processing of the wafer. The sample 232 may include any layers, features, or the like, as may be known to those skilled in the relevant field.

In the example shown in FIG. 2, the sample 232 includes a plurality of structures 210 which are formed on a substrate 205. The substrate 205 may be a semiconductor substrate of any suitable material for use in semiconductor device manufacturing. For example, the substrate 205 may be a silicon substrate; however, embodiments provided herein are not limited thereto. For example, in various embodiments, the substrate 205 may include gallium arsenide (GaAs), gallium nitride (GaN), silicon carbide (SiC), or any other semiconductor material. The substrate 205 may include various doping configurations depending upon design specifications.

The structures 210 are formed on the substrate 205, and the structures 210 may be structures formed of any material utilized in the manufacture of semiconductor devices. For example, in various embodiments, the structures 210 may be dielectric structures, conductive structures, semiconductor structures, or structures formed of any other layers or materials. The structures 210 in the example shown in FIG. 2 are the structures of the sample 232 which are to be analyzed or characterized (e.g., imaged) by the microscopy apparatus 120.

A protective capping layer 212 is formed on the structures 210. In some embodiments, the protective capping layer 212 is formed of a high strength and high hardness material. In various embodiments, the protective capping layer 212 includes at least one of platinum (Pt), titanium (Ti), tantalum (Ta), cobalt (Co), or nickel (Ni), or any alloy thereof.

In some embodiments, the protective capping layer 212 is formed of a metal or a metal-containing material having a Mohs hardness that is greater than 3.5. In some embodiments, the protective capping layer 212 has a Young Modulus that is greater than 158 Gpa. In some embodiments, the protective capping layer 212 is formed of a metal or a metal-containing material having a Mohs hardness that is greater than 3.5 and a Young Modulus that is greater than 158 Gpa.

The sample 232 further includes a gap filler 214 which contacts the protective capping layer 212 and which extends between the structures 210. In some embodiments, the gap filler 214 may contact the surface of the substrate 205, as shown. In various embodiments, the gap filler 214 may be formed of an organic or an inorganic material. In some embodiments, the gap filler 214 is formed of an organic material which is made of up at least 3% of carbon (C). In some embodiments, the gap filler 214 is formed of a material including at least one of carbon (C), oxygen (O), or nitrogen (N).

In some embodiments, the gap filler 214 is formed of a high aspect ratio material that is deposited by atomic layer deposition (ALD). For example, the gap filler 214 may be a high aspect ratio atomic layer deposited material including at least one of TiN, TaN, TiO, ZnO, AlO, Si, Ni, Co, or any combination or alloy thereof.

The protective capping layer 212 and the gap filler 214 may be formed, for example, by the deposition tool 112 of the sample preparation apparatus 110.

Figure 3:
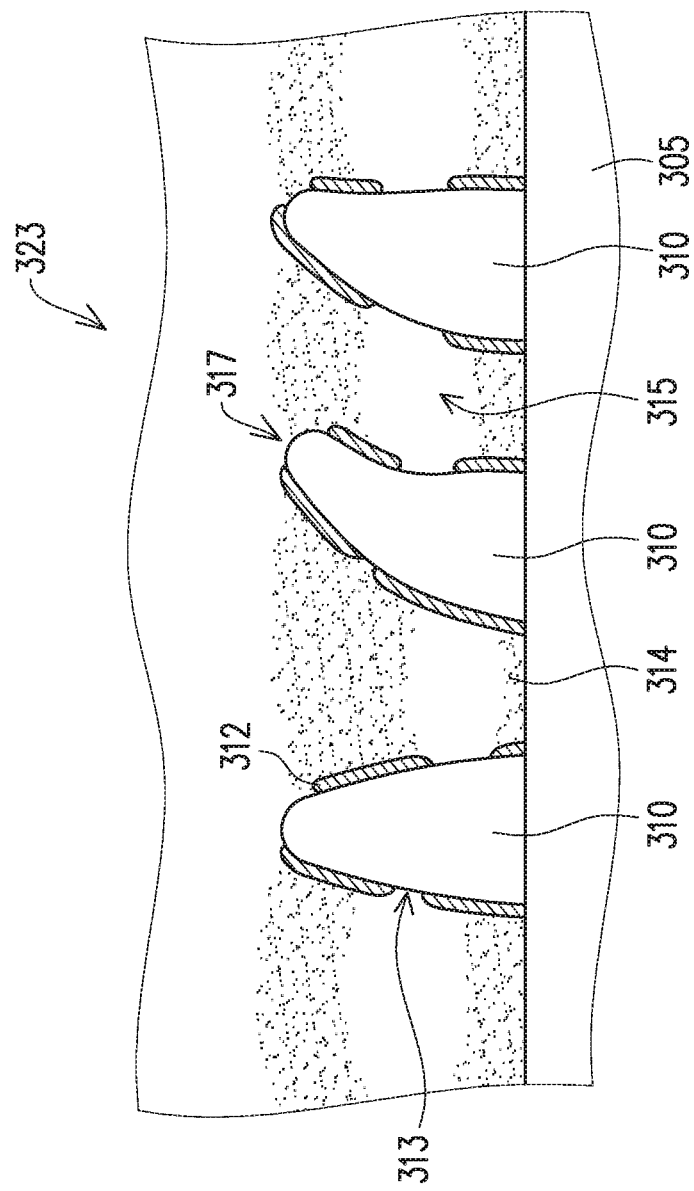
FIG. 3 is a cross-sectional diagram illustrating a comparative example semiconductor structure.

FIG. 3 is a cross-sectional diagram illustrating a comparative example semiconductor structure which may be viewed in comparison with the improved structure shown in FIG. 3. In the comparative example of FIG. 3, the sample 323 includes a protective capping layer 312 formed over a plurality of structures 310, which are formed on a substrate 310. A gap filler 314 is formed between the structures 310 and may at least partially contact the substrate 305. However, in contrast to the sample 232 shown in FIG. 2, the sample 323 includes various defects resulting from sample preparation or analysis by a microscopy apparatus. In particular, it is noted that when the gap filler 314 is irradiated with an electron beam (e.g., during sample preparation or during microscopy analysis), the gap filler 314 will shrink due to the composition of the gap filler 314. The shrinking of the gap filler 314 may result in voids 315 in the sample 323 (e.g., between adjacent structures 310) where the gap filler 314 is no longer present. Moreover, shrinking of the gap filler 314 may cause bending or breakage of portions of the structures 310, as the structures 310 may be supported by the gap filler 314 and thus may deform in response to deformations (e.g., shrinkage) of the gap filler 314. As shown in FIG. 3, the structures 310 may include one or more deformed portions 317 which may be, for example, bent due to deformation of the gap filler 314. In some examples, the deformed portions 317 of the structures 310 may be bent or otherwise deformed due to the protective capping layer 312 having a thickness that is too large.

Moreover, as shown in FIG. 3, the protective capping layer 312 of the sample 323 includes various defective regions 313. The defective regions 313 of the protective capping layer 312 may include cracks or broken portions which may result from shrinkage of the gap filler 314.

In contrast, referring again to the sample 232 shown in FIG. 2, by forming the protective capping layer 212 of a high strength and high hardness material (e.g., having a Mohs hardness that is greater than 3.5 and a Young Modulus that is greater than 158 Gpa), the protective capping layer 212 is more reliably attached to the surrounding gap filler 214, and the protective capping layer 212 can more firmly grasp the gap filler 214 so that it does not shrink during irradiation by the electron beam (e.g., during sample preparation or microscopy analysis). As shown in FIG. 2, the structures 210 may be substantially straight along an axis that is perpendicular to the surface of the substrate 205, and in some embodiments, each of the structures 210 of the sample 232 may be substantially symmetrical about a long axis of the structures 210 (e.g., an axis perpendicular to the surface of the substrate 205).

Moreover, by forming the gap filler 214 by an organic or ALD deposited film (in contrast to the gap filler 314 of FIG. 3, which is formed by chemical vapor deposition (CVD)), the gap filler 214 has a greatly improved pore filling rate and substantially fills the spaces between the structures 210 without occurrence of large voids or other defective regions. Furthermore, during sample preparation or microscopy analysis (e.g., by the sample preparation apparatus 110 and the microscopy apparatus 120), the sample 232 may be cooled by the cooling system 140, which may further reduce or prevent occurrence of defects in the protective capping layer 212 or the gap filler 214. For example, the cooled environment may reduce or prevent the undesirable effects of shrinkage of the gap filler material.

Referring again to FIG. 1, by analyzing the sample 132 (e.g., by imaging or otherwise characterizing the sample 132 by the sample preparation apparatus 110 or the microscopy apparatus 120), one or more defects in the sample 132 may be determined by the sample defect recognition circuitry 150, which facilitates remediation of the sample or adjustment of the sample preparation apparatus 110 so that samples are produced which are free of defects.

Figure 4:
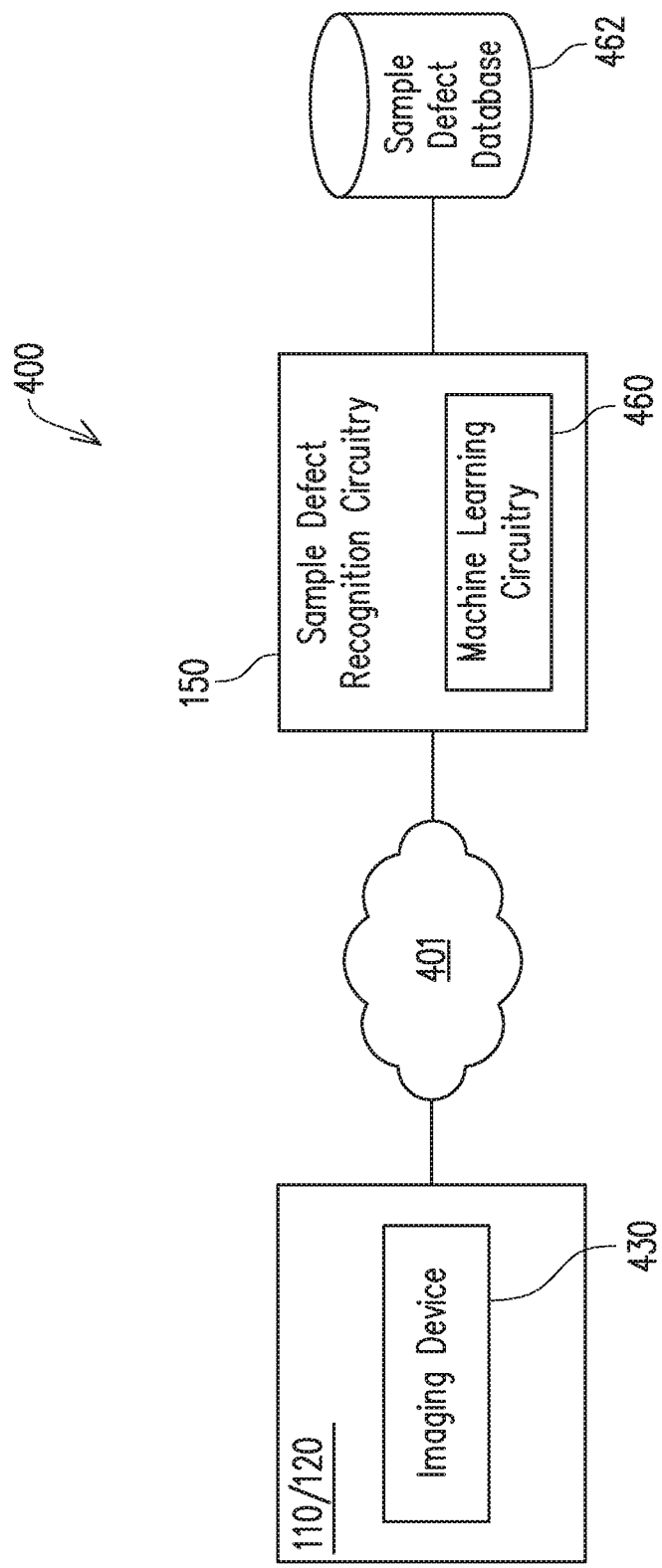
FIG. 4 is a block diagram illustrating a sample defect recognition system, in accordance with some embodiments.

FIG. 4 is a block diagram illustrating a sample defect recognition system 400, in accordance with embodiments of the present disclosure. The sample defect recognition system 400 may be used in conjunction with, and may include one or more of the features and functionality of, the semiconductor structure sample preparation and analysis system 100, shown in FIG. 1. For example, the sample defect recognition system 400 may include the sample defect recognition circuitry 150, as well as one or more features of the sample preparation apparatus 110 or the microscopy apparatus 120. However, embodiments provided by the present disclosure are not limited thereto.

As shown in FIG. 4, the sample defect recognition system 400 includes an imaging device 430 and sample defect recognition circuitry 150.

The imaging device 430 may be included in the sample preparation apparatus 110 or the microscopy apparatus 120. In FIG. 4, the sample preparation apparatus and microscopy apparatus are shown as being combined as part of a same apparatus, e.g., sample preparation and microscopy apparatus 110/120. The imaging device 430 may be or include, for example, features and functionalities of the detector 130 or the processor 134 shown in FIG. 1. For example, the imaging device 430 may be a device which produces an image of a sample during analysis by the sample preparation and microscopy apparatus 110/120, such as an image produced by TEM, SEM, or atom probe microscopy.

The imaging device 430 is communicatively coupled to the sample defect recognition circuitry 150 so that the sample defect recognition circuitry 150 receives images or image data associated with a sample that is output by the imaging device 430. The imaging device 430 may be communicatively coupled to the sample defect recognition circuitry 150 by any suitable communications network. The communications network may utilize one or more protocols to communicate via one or more physical networks, including local area networks, wireless networks, dedicated lines, intranets, the Internet, and the like.

In some embodiments, the communications network includes one or more electrical wires which communicatively couple the imaging device 430 to the sample defect recognition circuitry 150. In some embodiments, the communications network may include a wireless communications network 401 for communicating signals from the imaging device 430 to the sample defect recognition circuitry 150. For example, as shown in FIG. 4, the imaging device 430 may be communicatively coupled to the sample defect recognition circuitry 150 through a wireless network 401. In some embodiments, the sample defect recognition circuitry 150 may be included as part of the processor 134 of the microscopy apparatus 120 shown in FIG. 1.

The sample defect recognition circuitry 150 may be or include any electrical circuitry configured to perform the sample defect recognition techniques described herein. In some embodiments, the sample defect recognition circuitry 150 may include or be executed by a computer processor, a microprocessor, a microcontroller, or the like, configured to perform the various functions and operations described herein with respect to the sample defect recognition circuitry 150. For example, the sample defect recognition circuitry 150 may be executed by a computer processor selectively activated or reconfigured by a stored computer program, or may be a specially constructed computing platform for carrying out the features and operations described herein. In some embodiments, the sample defect recognition circuitry 150 may be configured to execute software instructions stored in any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The sample defect recognition circuitry 150 may receive images from the imaging device 430 of samples that are prepared or analyzed by the sample preparation and microscopy apparatus 110/120. The sample defect recognition circuitry 150 analyzes the images to predict or determine defects in the semiconductor structure sample, for example, based on a comparison of the received images of the sample with past data or analysis of the received images by a machine learning model that is trained with past data (e.g., past images of semiconductor structure samples having one or more defects) indicative of defects.

In some embodiments, the sample defect recognition circuitry 150 may predict or determine the presence of defects in a semiconductor structure sample by employing one or more artificial intelligence or machine learning techniques, which in some embodiments may be implemented at least in part by machine learning circuitry 460. Some or all of the determinations described herein that are made by the sample defect recognition circuitry 150 may be performed automatically by the sample defect recognition circuitry 150, for example, in response to receiving images of an examined semiconductor structure sample from the imaging device 430. The machine learning circuitry 460 may be included as part of the sample defect recognition circuitry 150 (as shown), or may be remotely located and communicatively coupled to the sample defect recognition circuitry 150. The machine learning circuitry 460 may predict or determine the presence of defects in a semiconductor structure sample by using past data (e.g., the machine learning circuitry 460 may be trained based on past data) indicative of defects or defective conditions in semiconductor structure samples, and the machine learning circuitry 460 may compare the received images with the past data to predict or determine the presence of defects in a semiconductor structure sample based on similarities or deviations from the past data or from a trained model contained within, managed by, or otherwise accessible to the machine learning circuitry 460.

"Artificial intelligence" is used herein to broadly describe any computationally intelligent systems and methods that can learn knowledge (e.g., based on training data), and use such learned knowledge to adapt its approaches for solving one or more problems, for example, by making inferences based on a received input, such as the received images of semiconductor structure samples. Machine learning generally refers to a sub-field or category of artificial intelligence, and is used herein to broadly describe any algorithms, mathematical models, statistical models, or the like that are implemented in one or more computer systems or circuitry, such as processing circuitry, and which build one or more models based on sample data (or training data) in order to make predictions or decisions.

The sample defect recognition circuitry 150 or the machine learning circuitry 460 may employ, for example, neural network, deep learning, convolutional neural network, Bayesian program learning, support vector machines, and pattern recognition techniques to solve problems such as predicting or determining the presence of defects in semiconductor structure samples. Further, the sample defect recognition circuitry 150 or the machine learning circuitry 460 may implement any one or combination of the following computational algorithms or techniques: classification, regression, supervised learning, unsupervised learning, feature learning, clustering, decision trees, image recognition, or the like.

As one example, an artificial neural network may be utilized by the sample defect recognition circuitry 150 or the machine learning circuitry 460 to develop, train, or update one or more machine learning models which may be utilized to predict or determine the presence of defects in semiconductor structure samples. An example artificial neural network may include a plurality of interconnected "neurons" which exchange information between each other. The connections have numeric weights that can be tuned based on experience, and thus neural networks are adaptive to inputs and are capable of learning. The "neurons" may be included in a plurality of separate layers which are connected to one another, such as an input layer, a hidden layer, and an output layer. The neural network may be trained by providing training data (e.g., past data or past images which are indicative of defects in semiconductor structure samples) to the input layer. Through training, the neural network may generate and/or modify the hidden layer, which represents weighted connections mapping the training data provided at the input layer to known output information at the output layer (e.g., classification of received image data as having one or more defects, defective conditions, or the like). Relationships between neurons of the input layer, hidden layer, and output layer, formed through the training process and which may include weight connection relationships, may be stored, for example, as one or more machine learning models within or otherwise accessible to the machine learning circuitry 460.

Once the neural network has been sufficiently trained, the neural network may be provided with non-training data (e.g., new images of semiconductor structure samples received during operation of the sample preparation and microscopy apparatus 110/120) at the input layer. Utilizing sample defect knowledge (e.g., as stored in the machine learning model, and which may include, for example, weighted connection information between neurons of the neural network), the neural network may make determinations about the received images at the output layer. For example, the neural network may predict or determine the presence of defects in the semiconductor structure sample.

Employing one or more computationally intelligent and/or machine learning techniques, the sample defect recognition circuitry 150 may learn (e.g., by developing and/or updating a machine learning algorithm or model based on training data) to predict or determine the presence of defects in semiconductor structure samples based at least in part on knowledge, inferences or the like developed or otherwise learned through training of the machine learning circuitry 460.

In some embodiments, the sample defect recognition circuitry 150 or the machine learning circuitry 460 may determine the presence of defects in semiconductor structure samples based on determined or recognized dimensions or spatial arrangements of the protective capping layer 212 and of the gap filler 214. For example, in some embodiments, the sample defect recognition circuitry 150 or the machine learning circuitry 460 is configured to determine or recognize thicknesses of the protective capping layer 212 and of the gap filler 214. The sample defect recognition circuitry 150 or the machine learning circuitry 460 may determine that an examined sample (e.g., imaged by the imaging device 430) includes one or more defects based on thicknesses of the protective capping layer 212 or of the gap filler 214. For example, a defect may be determined to be present in a sample if the thickness of the protective capping layer 212 or of the gap filler 214 exceeds a threshold thickness, which may be varied depending on a particular design of the semiconductor structure that is examined.

The machine learning circuitry 460 may be implemented in one or more processors having access to instructions, which may be stored in any computer-readable storage medium, which may be executed by the machine learning circuitry 460 to perform any of the operations or functions described herein.

In some embodiments, the machine learning circuitry 460 is communicatively coupled to a sample defect database 462, which may be stored, for example, in any computer-readable storage medium. The sample defect database 462 may include information that associates semiconductor structure features (e.g., as apparent in images of semiconductor structure samples, such as thicknesses of the protective capping layer and the gap filler) with defects or defective conditions. In some embodiments, the sample defect database 462 stores a plurality of historical (e.g., past) images that are known to represent or otherwise include one or more defects.

In some embodiments, the machine learning circuitry 460 may be trained based on the historical images stored in the sample defect database 462. That is, the historical images may be provided as training data for training the machine learning circuitry 460, and the algorithm or machine learning model contained within or accessible to the machine learning circuitry 460 may be updated or modified based on the historical images stored in the sample defect database 462, so that the trained machine learning circuitry 460 may predict or determine the presence of defects in semiconductor structure samples.

In some embodiments, the training data (e.g., historical images stored in the sample defect database 462) may be or include labeled training data from which the machine learning circuitry 460 or the sample defect recognition circuitry 150 may learn to predict or determine defects in semiconductor structure samples. The labeled training data may include labels indicating that one or more of the images stored in the sample defect database 462 represents, for example, defective structures, dimensions or spatial arrangements of layers (e.g., the protective capping layer or the gap filler) associated with defects, or other defects.

During use of the sample preparation and microscopy apparatus 110/120, the semiconductor structure samples are examined (e.g., imaged by the imaging device 430) to generate images. The images may then be analyzed by the sample defect recognition circuitry 150 or the machine learning circuitry 460 to predict or determine the presence of defects in the semiconductor structure samples. The sample defect recognition circuitry 150 or the machine learning circuitry 460 may analyze the received images, for example, by comparing the received images with historical images stored in the sample defect database 462 which are known to be associated with defects. In some embodiments, the sample defect recognition circuitry 150 or the machine learning circuitry 460 may analyze the received images 500 by utilizing a trained machine learning model, such as a neural network or the like.

In some embodiments, the sample defect recognition circuitry 150 may be communicatively coupled to sample preparation and microscopy apparatus 110/120 and may communicate (e.g., to the processor 134) information indicating whether an examined sample contains one or more defects. For example, in some embodiments, the sample defect recognition circuitry 150 may communicate to the processor 134 that a particular sample is determined to include one or more defects, in which case, the examination of the sample by the sample preparation and microscopy apparatus 110/120 may be stopped and further investigation may be undertaken to determine the cause of the defect in the sample. For example, one or more adjustments may be made to the sample preparation apparatus 110 to reduce or prevent the occurrence of the same determined defect in future samples that are to be prepared by the sample preparation apparatus 110.

Figure 5:
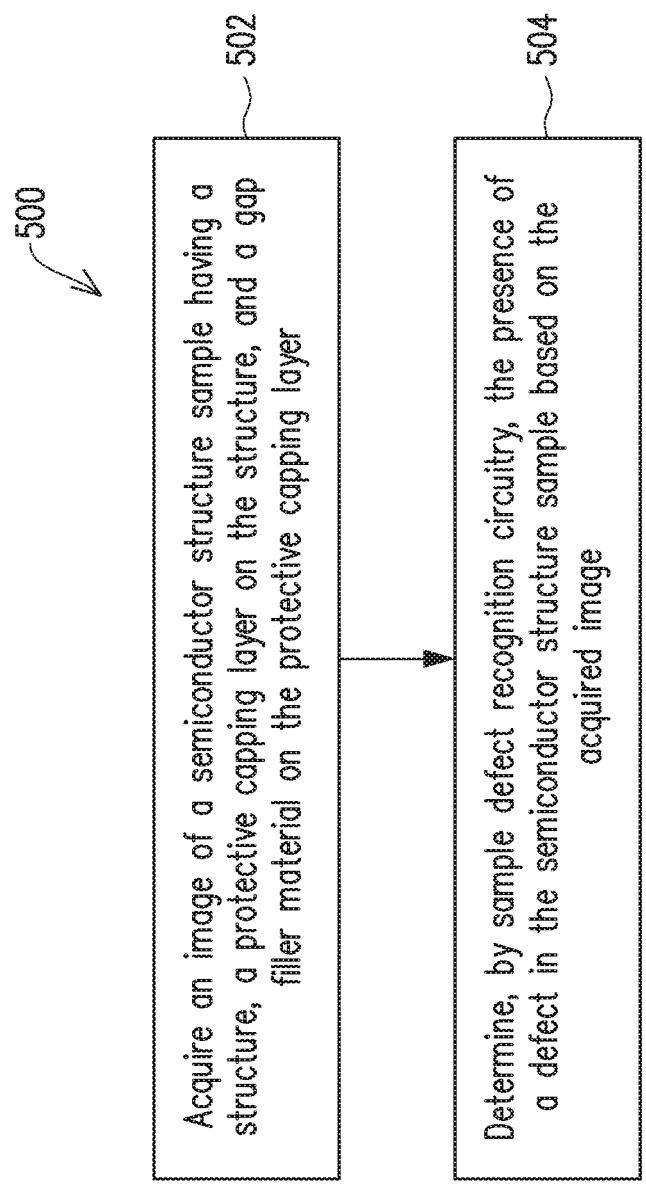
FIG. 5 is a flowchart illustrating a semiconductor structure sample defect detection method, in accordance with one or more embodiments.

FIG. 5 is a flowchart 500 illustrating a semiconductor structure sample defect detection method, in accordance with one or more embodiments. The semiconductor structure sample defect detection method may be implemented at least in part, for example, by the semiconductor structure sample preparation and analysis system 100 shown in and described with respect to FIG. 1 or the sample defect recognition system 400 shown in and described with respect to FIG. 4.

At 502, the method includes acquiring an image of a semiconductor structure sample. The semiconductor structure sample includes a structure 210, a protective capping layer 212 on the structure, and a gap filler material 214 on the protective capping layer 212. The semiconductor structure sample may have various different shapes, sizes, materials, or the like, depending on a type of semiconductor device which is to be formed on a semiconductor wafer, for example, and the semiconductor structure sample may be extracted from the wafer by a sample preparation apparatus 110.

In some embodiments, the method may include forming the protective capping layer 212 on the structure 210, and forming the gap filler material 214 on the protective capping layer 212. In some embodiments, the protective capping layer may have a Mohs hardness that is greater than 3.5 and a Young Modulus that is greater than 158 Gpa. In some embodiments, the gap filler material may be formed of an organic material which is made of up at least 3% of carbon. In some embodiments, the gap filler material may be formed by depositing, by atomic layer deposition, the gap filler material on the protective capping layer, and the gap filler material may include at least one of TiN, TaN, TiO, ZnO, AlO, Si, Ni, or Co.

At 504, the method includes determining, by sample defect recognition circuitry 150, the presence of a defect in the semiconductor structure sample based on the acquired image. In some embodiments, the method may include determining the presence of a defect in the semiconductor structure by analyzing the acquired image by machine learning circuitry trained to determine the presence of defects based on a plurality of historical images that are associated with semiconductor structure samples having one or more defects.

In some embodiments, the method may further include maintaining, by a cooling system, an environment in which the semiconductor structure sample is prepared at a temperature that is less than 25° C.

Embodiments of the present disclosure provide several advantages, and provide technical solutions to technical problems that are present, for example, within the field of semiconductor fabrication and microscopy apparatuses, systems, and methods. For example, embodiments of the disclosure are operable to predict or determine the presence of defects in a semiconductor structure sample that is prepared for microscopy analysis. This provides a significant advantage over conventional systems in which such defects cannot be predicted, which results in lower quality samples and can lead to low yield during testing of samples since the sample defects are not recognized and thus the source of such defects is not identified. This results in increased costs and reduced profits. Moreover, the present disclosure provides improved protective capping layers and gap fillers which reduce or prevent defects during the preparation of the semiconductor structure samples.

According to one embodiment, a semiconductor structure sample preparation and analysis system includes a semiconductor structure sample that includes a structure, a protective capping layer on the structure, and a gap filler material on the protective capping layer. A microscopy apparatus is configured to acquire an image of the semiconductor structure sample. Sample defect recognition circuitry is configured to determine the presence of a defect in the semiconductor structure sample based on the acquired image.

According to another embodiment, a method is provided that includes acquiring, by an imaging device, an image of a semiconductor structure sample having a structure, a protective capping layer on the structure, and a gap filler material on the protective capping layer. Sample defect recognition circuitry determines the presence of a defect in the semiconductor structure sample based on the acquired image.

According to yet another embodiment, a semiconductor structure sample for microscopy analysis is provided that includes a semiconductor substrate, a structure on the semiconductor substrate, and a protective capping layer on the structure. The protective capping layer has at least one of: a Mohs hardness that is greater than 3.5 or a Young Modulus that is greater than 158 Gpa. A gap filler layer is disposed on the protective capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor structure sample preparation and analysis system, comprising:
   a semiconductor structure sample, the semiconductor structure sample including a substrate, a structure on a surface of the substrate, a protective capping layer on the structure and contacting the surface of the substrate, and a gap filler material on the protective capping layer and contacting the surface of the substrate;
   a microscopy apparatus configured to acquire an image of the semiconductor structure sample; and
   sample defect recognition circuitry configured to determine the presence of a defect in the semiconductor structure sample based on the acquired image.

2. The system of claim 1, further comprising:
   a database communicatively coupled to the sample defect recognition circuitry, the database storing image information associated with semiconductor structure samples having one or more defects,
   wherein the sample defect recognition prediction circuitry is configured to determine the presence of a defect in the semiconductor structure sample based on the acquired image and the information stored in the database.

3. The system of claim 1 wherein the protective capping layer includes at least one of platinum (Pt), titanium (Ti), tantalum (Ta), cobalt (Co), or nickel (Ni).

4. The system of claim 1 wherein the gap filler is formed of an organic material which is made of up at least 3% of carbon.

5. The system of claim 1 wherein the gap filler is formed of an atomic layer deposited material including at least one of TiN, TaN, TiO, ZnO, AlO, Si, Ni, or Co.

6. The system of claim 1 wherein the protective capping layer is formed of a material having a Mohs hardness that is greater than 3.5.

7. The system of claim 6 wherein the material of the protective capping layer has a Young Modulus that is greater than 158 Gpa.

8. The system of claim 1, further comprising:
   a sample preparation apparatus configured to extract the semiconductor structure sample from a semiconductor wafer; and
   a cooling system in fluid communication with an environment in which the semiconductor structure sample is disposed in at least one of the sample preparation apparatus or the microscopy apparatus, the cooling system configured to cool the environment.

9. The system of claim 8 wherein the cooling system is configured to cool the environment to a temperature that is less than 25° C.

10. A method, comprising:
    acquiring, by an imaging device, an image of a semiconductor structure sample having a substrate, a structure on a surface of the substrate, a protective capping layer on the structure and contacting the surface of the substrate, and a gap filler material on the protective capping layer and contacting the surface of the substrate; and
    determining, by sample defect recognition circuitry, the presence of a defect in the semiconductor structure sample based on the acquired image.

11. The method of claim 10 wherein the determining the presence of a defect in the semiconductor structure includes analyzing the acquired image by machine learning circuitry trained to determine the presence of defects based on a plurality of historical images that are associated with semiconductor structure samples having one or more defects.

12. The method of claim 10, further comprising:
    preparing the semiconductor structure sample, the preparing the semiconductor structure sample including:
       forming the protective capping layer on the structure; and
       forming the gap filler material on the protective capping layer.

13. The method of claim 12 wherein the forming the protective capping layer on the structure includes:
    forming the protective capping layer of a material including at least one of platinum (Pt), titanium (Ti), tantalum (Ta), cobalt (Co), or nickel (Ni).

14. The method of claim 12 wherein the forming the protective capping layer on the structure includes:
    forming the protective capping layer having a Mohs hardness that is greater than 3.5 and a Young Modulus that is greater than 158 Gpa.

15. The method of claim 12 wherein the forming the gap filler material on the protective capping layer includes:
    forming the gap filler material of an organic material which is made of up at least 3% of carbon.

16. The method of claim 12 wherein the forming the gap filler material on the protective capping layer includes:
    depositing, by atomic layer deposition, the gap filler material on the protective capping layer, the gap filler material including at least one of TiN, TaN, TiO, ZnO, AlO, Si, Ni, or Co.

17. The method of claim 12, further comprising:
    maintaining, by a cooling system, an environment in which the semiconductor structure sample is prepared at a temperature that is less than 25° C.

18. A semiconductor structure sample for microscopy analysis, comprising:
    a semiconductor substrate having a surface;
    a structure on the surface of the semiconductor substrate;
    a protective capping layer on the structure and contacting the surface of the substrate, the protective capping layer having at least one of: a Mohs hardness that is greater than 3.5 or a Young Modulus that is greater than 158 Gpa; and a gap filler layer on the protective capping layer and contacting the surface of the substrate.

19. The semiconductor structure sample of claim 18 wherein the gap filler layer comprises at least one of: an organic material which is made of up at least 3% of carbon, or an atomic layer deposited material including at least one of TiN, TaN, TiO, ZnO, AlO, Si, Ni, or Co.

20. The semiconductor sample of claim 18 wherein the protective capping layer has a Mohs hardness that is greater than 3.5 and a Young Modulus that is greater than 158 Gpa.

* * * * *